(12) United States Patent
Maharyta et al.

(10) Patent No.: US 8,093,914 B2
(45) Date of Patent: Jan. 10, 2012

(54) COMPENSATION CIRCUIT FOR A TX-RX CAPACITIVE SENSOR

(75) Inventors: Andriy Maharyta, Lviv (UA); Viktor Kremin, Lviv (UA)

(73) Assignee: Cypress Semiconductor Corporation, San Jose, CA (US)

( * ) Notice: Subject to any disclaimer, the term of this patent is extended or adjusted under 35 U.S.C. 154(b) by 314 days.

(21) Appl. No.: 12/332,980

(22) Filed: Dec. 11, 2008

(65) Prior Publication Data

US 2009/0153152 A1    Jun. 18, 2009

Related U.S. Application Data

(60) Provisional application No. 61/013,986, filed on Dec. 14, 2007.

(51) Int. Cl.
*G01R 27/26* (2006.01)
(52) U.S. Cl. .................................... 324/684; 324/686
(58) Field of Classification Search .................. 324/684, 324/686; 345/173, 174, 178; 178/18.06, 178/19.03
See application file for complete search history.

(56) References Cited

U.S. PATENT DOCUMENTS

| 6,768,420 | B2 | 7/2004 | McCarthy et al. |
| 7,006,938 | B2 * | 2/2006 | Laraia et al. ................. 702/104 |
| 7,075,864 | B2 | 7/2006 | Kakitsuka et al. |
| 2005/0283330 | A1 | 12/2005 | Laraia et al. |
| 2007/0173220 | A1 | 7/2007 | Kim et al. |
| 2008/0158178 | A1 | 7/2008 | Hotelling et al. |

OTHER PUBLICATIONS

International Search Report of the International Searching Authority, dated Feb. 9, 2009 for International Application No. PCT/US2008/013622; 2 pages.
International Written Opinion of the International Searching Authority, dated Feb. 9, 2009 for International Application No. PCT/US2008/013622; 5 pages.
Dong-Ki Min and Jong Up Jeon, "Offset Compensation of Capacitive Sensors for Electrostatic Microactuators", ISIE 2001, Pusan Korea, pp. 2114-2117.

* cited by examiner

*Primary Examiner* — Timothy J Dole

(57) ABSTRACT

A capacitive sensor may include a transmit electrode and a receive electrode capacitively coupled with the transmit electrode. A capacitance sensing circuit senses a capacitance between the transmit and receive electrodes by applying a signal to the transmit electrode and rectifying a current waveform induced at the receive electrode. A compensation circuit reduces the effect of a mutual and parasitic capacitances of the transmit and receive electrode pair by adding a compensation current to the rectified current.

20 Claims, 10 Drawing Sheets

COMPENSATION CIRCUIT FOR A TX-RX CAPACITIVE SENSOR

CROSS-REFERENCE TO RELATED APPLICATIONS

This application claims the benefit of U.S. Provisional Patent Application No. 61/013,986, filed Dec. 14, 2007.

TECHNICAL FIELD

This disclosure relates to the field of user interface devices and, in particular, to capacitive sensor devices.

BACKGROUND

Computing devices, such as notebook computers, personal data assistants (PDAs), kiosks, and mobile handsets, have user interface devices, which are also known as human interface devices (HID). One user interface device that has become more common is a touch-sensor pad (also commonly referred to as a touchpad). A basic notebook computer touch-sensor pad emulates the function of a personal computer (PC) mouse. A touch-sensor pad is typically embedded into a PC notebook for built-in portability. A touch-sensor pad replicates mouse X/Y movement by using two defined axes which contain a collection of sensor elements that detect the position of a conductive object, such as a finger. Mouse right/left button clicks can be replicated by two mechanical buttons, located in the vicinity of the touchpad, or by tapping commands on the touch-sensor pad itself. The touch-sensor pad provides a user interface device for performing such functions as positioning a pointer, or selecting an item on a display. These touch-sensor pads may include multi-dimensional sensor arrays for detecting movement in multiple axes. The sensor array may include a one-dimensional sensor array, detecting movement in one axis. The sensor array may also be two dimensional, detecting movements in two axes.

One type of touchpad operates by way of capacitance sensing utilizing capacitance sensors. The capacitance, detected by a capacitance sensor, changes as a function of the proximity of a conductive object to the sensor. The conductive object can be, for example, a stylus or a user's finger. In a touch-sensor device, a change in capacitance detected by each sensor in the X and Y dimensions of the sensor array due to the proximity or movement of a conductive object can be measured by a variety of methods. Regardless of the method, usually an electrical signal representative of the capacitance detected by each capacitive sensor is processed by a processing device, which in turn produces electrical or optical signals representative of the position of the conductive object in relation to the touch-sensor pad in the X and Y dimensions. A touch-sensor strip, slider, or button operates on the same capacitance-sensing principle.

A first type of conventional touchpad is composed of a matrix of rows and columns. Within each row or column, there are multiple sensor elements. However, all sensor pads within each row or column are coupled together and operate as one long sensor element. A second type of conventional touchpad is composed of an XY array of independent sense elements, where each sensor element in a row or column is separately sensed. Here, each row and column is composed of multiple sensing elements, each capable of independent detection of a capacitive presence and magnitude. These may then be used to detect any number of substantially simultaneous touches.

The capacitive sensing systems used in interface devices such as touchpads generally operate by detecting changes in the capacitances of the capacitive sensors resulting from proximity or contact of an object with the sensor, however the ability to resolve changes in capacitance may be impaired if the changes in capacitance to be detected by the sensor are small relative to the capacitance of the sensor. For instance, a capacitive sensor element that is configured to detect an input, such as proximity or contact with a finger or other object, may have a capacitance $C_P$ between the sensor element and ground when no input is present. The capacitance $C_P$ is known as the parasitic capacitance of the sensor. For capacitive sensors having multiple sense elements, a mutual capacitance $C_M$ may also be present between two or more sense elements. An input detected by the sensor may cause a change in capacitance $C_F$ that is much smaller than $C_P$ or $C_M$. Accordingly, where the sensor capacitance is represented as a digital code, the parasitic or mutual capacitances may be represented by a larger proportion of the discrete capacitance levels resolvable by the digital code, while the capacitance change $C_F$ is represented by fewer of these discrete levels. In such cases, the capacitance change $C_F$ due to an input may not be resolvable to a high degree of resolution.

BRIEF DESCRIPTION OF THE DRAWINGS

The present disclosure is illustrated by way of example, and not by way of limitation, in the figures of the accompanying drawings.

DETAILED DESCRIPTION

Figure 1A:
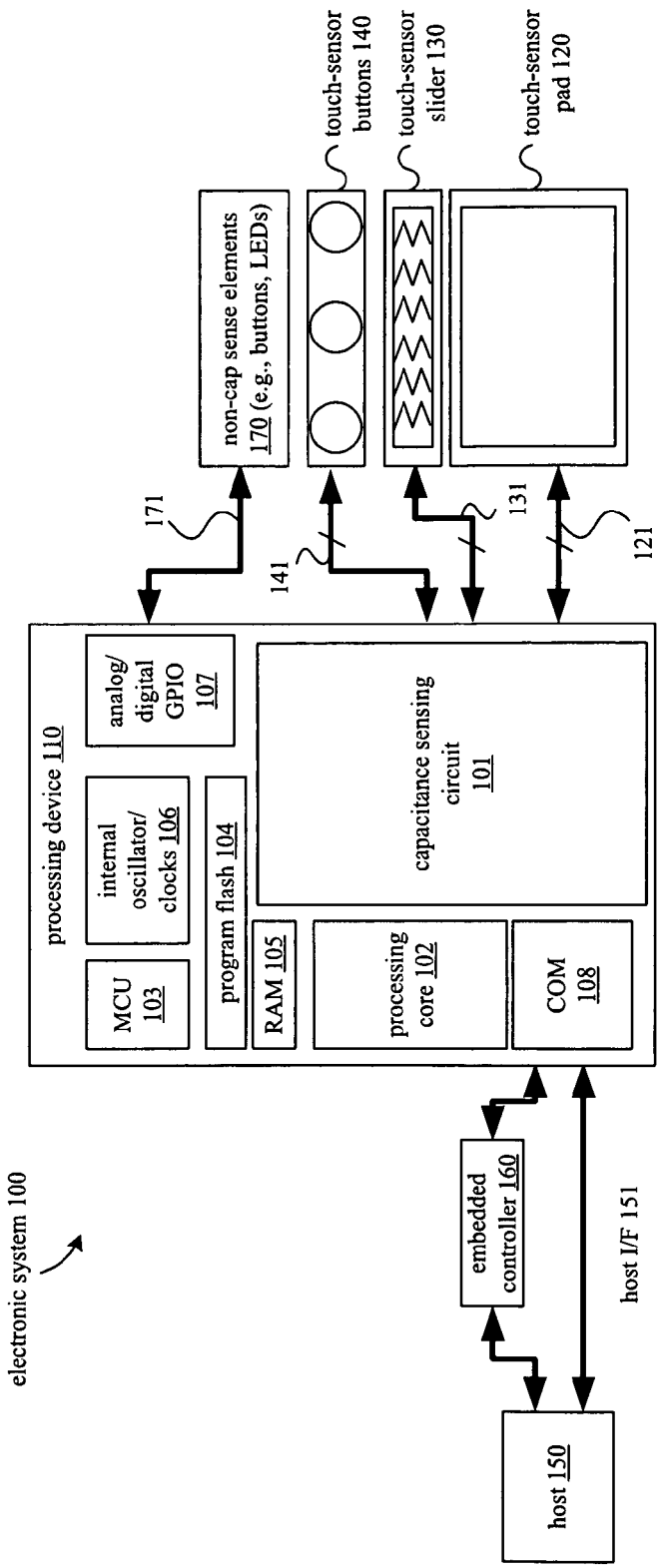
FIG. 1A illustrates a block diagram of one embodiment of an electronic system having a processing device for detecting a presence of a conductive object.

Described herein is a method and apparatus for measuring a capacitance of a capacitive sensor while compensating for parasitic capacitance influence and mutual capacitance constant part of the sensor. The following description sets forth numerous specific details such as examples of specific systems, components, methods, and so forth, in order to provide a good understanding of several embodiments of the present invention. It will be apparent to one skilled in the art, however, that at least some embodiments of the present invention may be practiced without these specific details. In other instances, well-known components or methods are not described in detail or are presented in simple block diagram format in order to avoid unnecessarily obscuring the present invention. Thus, the specific details set forth are merely exemplary. Particular implementations may vary from these exemplary details and still be contemplated to be within the spirit and scope of the present invention.

Embodiments of a method and apparatus for detecting an input to a capacitive sensor are described. In one embodiment, the sensor elements of a TX-RX capacitive sensor include at least one transmit (TX) electrode and at least one receive (RX) electrode. Each of the sensor elements, including the transmit and receive electrodes, has a parasitic capacitance $C_P$ and a mutual capacitance $C_M$. The parasitic capacitance of a sensor element is the capacitance between the sensor element and ground. The mutual capacitance of the sensor element is the capacitance between the sensor element and other sensor elements.

In one embodiment, a capacitance sensing circuit detects an input at the capacitive sensor by detecting a change in the capacitance of a sensor element. For example, a finger placed near a sensor element may cause a decrease in the capacitance of the sensor element. The magnitude of this change in capacitance can be detected and converted to a voltage level or a digital code that can be processed by a computer or other circuit.

In one embodiment for using a capacitive sensor having transmit and receive electrodes, a signal applied to a transmit electrode induces a current at a receive electrode due to capacitive coupling between the transmit and receive electrodes. The magnitude of the current induced at the receive electrode depends on the degree of capacitive coupling between the electrodes. The proximity of an object, such as a finger, near the electrodes may change the capacitance between the electrodes, as well as the capacitance between the electrodes and ground. This change in turn affects the amount of current induced at the receive electrode. Thus, the magnitude of the induced current reflects the change in capacitance of the transmit and receive electrodes due to the input. In one embodiment, the induced current may further be converted to a digital code and represented as one of a finite number of discrete levels.

The measured capacitance of the sensor element also includes the parasitic and mutual capacitances $C_P$ and $C_M$ in addition to $C_F$. The baseline capacitance may also be described as the capacitance of the sensor element when no input (i.e., a finger touch) is present. The ability of the digital code to resolve many levels of $C_F$ may be degraded if the baseline capacitance, resulting from $C_P$ and $C_M$, is large in comparison to $C_F$. Therefore, the dynamic range of the conversion circuit is not used effectively, as the small variations of $C_M$ are measured in the presence of the large base value of $C_M$. Thus, in one embodiment, the effects of base value of $C_M$ are compensated, allowing the digital code to resolve $C_F$ using a greater number of discrete levels, improving the dynamic range utilization by scaling the small capacitance changes to the full input range of the capacitance sensing circuit.

One embodiment of a compensation circuit that minimizes the effects of parasitic and constant part of the mutual capacitances supplies a compensation current that is calibrated to cancel a portion of current attributable to the baseline capacitance of the sensor. Thus, the synchronously demodulated current from the receive electrode is minimized when no input is present at the capacitive sensor. Accordingly, more of the discrete levels resolvable by the digital code are available for representing the full dynamic range of $C_F$. The parasitic capacitance $C_P$ of the receive electrode is compensated by keeping the receive electrode potential close to constant during circuit operation using the voltage buffer, reducing the effects of recharging $C_P$ during circuit operation.

FIG. 1A illustrates a block diagram of one embodiment of an electronic system in which a capacitance sensor with a parasitic and mutual capacitance compensation circuit can be implemented. Electronic system 100 includes processing device 110, touch-sensor pad 120, touch-sensor slider 130, touch-sensor buttons 140, host processor 150, embedded controller 160, and non-capacitance sensor elements 170. The processing device 110 may include analog and/or digital general purpose input/output ("GPIO") ports 107. GPIO ports 107 may be programmable. GPIO ports 107 may be coupled to a Programmable Interconnect and Logic ("PIL"), which acts as an interconnect between GPIO ports 107 and a digital block array of the processing device 110 (not illustrated). The digital block array may be configured to implement a variety of digital logic circuits (e.g., DACs, digital filters, or digital control systems) using, in one embodiment, configurable user modules ("UMs"). The digital block array may be coupled to a system bus. Processing device 110 may also include memory, such as random access memory (RAM) 105 and program flash 104. RAM 105 may be static RAM (SRAM), and program flash 104 may be a non-volatile storage, which may be used to store firmware (e.g., control algorithms executable by processing core 102 to implement operations described herein). Processing device 110 may also include a memory controller unit (MCU) 103 coupled to memory and the processing core 102.

The processing device 110 may also include an analog block array (not illustrated). The analog block array is also coupled to the system bus. Analog block array also may be configured to implement a variety of analog circuits (e.g., ADCs or analog filters) using, in one embodiment, configurable UMs. The analog block array may also be coupled to the GPIO 107.

As illustrated, capacitance sensing circuit 101 may be integrated into processing device 110. Capacitance sensing circuit 101 may include analog I/O for coupling to an external component, such as touch-sensor pad 120, touch-sensor slider 130, touch-sensor buttons 140, and/or other devices. Capacitance sensing circuit 101 and processing device 102 are described in more detail below.

The embodiments described herein are not limited to touch-sensor pads for notebook implementations, but can be used in other capacitive sensing implementations, for example, the sensing device may be a touch screen, a touch-sensor slider 130, or touch-sensor buttons 140 (e.g., capacitance sensing buttons). In one embodiment, these sensing devices may include one or more capacitive sensors. It should also be noted that the embodiments described herein may be implemented in other sensing technologies than capacitive sensing, such as resistive, optical imaging, surface wave, infrared, dispersive signal, and strain gauge technologies. Similarly, the operations described herein are not limited to notebook pointer operations, but can include other operations, such as lighting control (dimmer), volume control, graphic equalizer control, speed control, or other control operations requiring gradual or discrete adjustments. It should also be noted that these embodiments of capacitive sensing implementations may be used in conjunction with non-capacitive sensing elements, including but not limited to pick buttons, sliders (ex. display brightness and contrast), scroll-wheels, multi-media control (ex. volume, track advance, etc) handwriting recognition and numeric keypad operation.

In one embodiment, the electronic system 100 includes a touch-sensor pad 120 coupled to the processing device 110 via bus 121. Touch-sensor pad 120 may include a multi-dimension sensor array. The multi-dimension sensor array includes multiple sensor elements, organized as rows and columns. In another embodiment, the electronic system 100 includes a touch-sensor slider 130 coupled to the processing device 110 via bus 131. Touch-sensor slider 130 may include a single-dimension sensor array. The single-dimension sensor array includes multiple sensor elements, organized as rows, or alternatively, as columns. In another embodiment, the electronic system 100 includes touch-sensor buttons 140 coupled to the processing device 110 via bus 141. Touch-sensor buttons 140 may include a single-dimension or multi-dimension sensor array. The single- or multi-dimension sensor array may include multiple sensor elements. For a touch-sensor button, the sensor elements may be coupled together to detect a presence of a conductive object over the entire surface of the sensing device. Alternatively, the touch-sensor buttons 140 may have a single sensor element to detect the presence of the conductive object. In one embodiment, touch-sensor buttons 140 may include a capacitive sensor element. Capacitive sensor elements may be used as non-contact sensor elements. These sensor elements, when protected by an insulating layer, offer resistance to severe environments.

The electronic system 100 may include any combination of one or more of the touch-sensor pad 120, touch-sensor slider 130, and/or touch-sensor button 140. In another embodiment, the electronic system 100 may also include non-capacitance sensor elements 170 coupled to the processing device 110 via bus 171. The non-capacitance sensor elements 170 may include buttons, light emitting diodes (LEDs), and other user interface devices, such as a mouse, a keyboard, or other functional keys that do not require capacitance sensing. In one embodiment, buses 171, 141, 131, and 121 may be a single bus. Alternatively, these buses may be configured into any combination of one or more separate buses.

Processing device 110 may include internal oscillator/clocks 106 and communication block 108. The oscillator/clocks block 106 provides clock signals to one or more of the components of processing device 110. Communication block 108 may be used to communicate with an external component, such as a host processor 150, via host interface (I/F) line 151. Alternatively, processing block 110 may also be coupled to embedded controller 160 to communicate with the external components, such as host 150. In one embodiment, the processing device 110 is configured to communicate with the embedded controller 160 or the host 150 to send and/or receive data.

Processing device 110 may reside on a common carrier substrate such as, for example, an integrated circuit (IC) die substrate, a multi-chip module substrate, or the like. Alternatively, the components of processing device 110 may be one or more separate integrated circuits and/or discrete components. In one exemplary embodiment, processing device 110 may be a Programmable System on a Chip (PSoC™) processing device, manufactured by Cypress Semiconductor Corporation, San Jose, Calif. Alternatively, processing device 110 may be one or more other processing devices known by those of ordinary skill in the art, such as a microprocessor or central processing unit, a controller, special-purpose processor, digital signal processor (DSP), an application specific integrated circuit (ASIC), a field programmable gate array (FPGA), or the like.

It should also be noted that the embodiments described herein are not limited to having a configuration of a processing device coupled to a host, but may include a system that measures the capacitance on the sensing device and sends the raw data to a host computer where it is analyzed by an application. In effect the processing that is done by processing device 110 may also be done in the host.

Capacitance sensing circuit 101 may be integrated into the IC of the processing device 110, or alternatively, in a separate IC. Alternatively, descriptions of capacitance sensing circuit 101 may be generated and compiled for incorporation into other integrated circuits. For example, behavioral level code describing capacitance sensing circuit 101, or portions thereof, may be generated using a hardware descriptive language, such as VHDL or Verilog, and stored to a machine-accessible medium (e.g., CD-ROM, hard disk, floppy disk, etc.). Furthermore, the behavioral level code can be compiled into register transfer level ("RTL") code, a netlist, or even a circuit layout and stored to a machine-accessible medium. The behavioral level code, the RTL code, the netlist, and the circuit layout all represent various levels of abstraction to describe capacitance sensing circuit 101.

It should be noted that the components of electronic system 100 may include all the components described above. Alternatively, electronic system 100 may include only some of the components described above.

In one embodiment, electronic system 100 may be used in a notebook computer. Alternatively, the electronic device may be used in other applications, such as a mobile handset, a personal data assistant (PDA), a keyboard, a television, a remote control, a monitor, a handheld multi-media device, a handheld video player, a handheld gaming device, or a control panel.

Figure 1B:
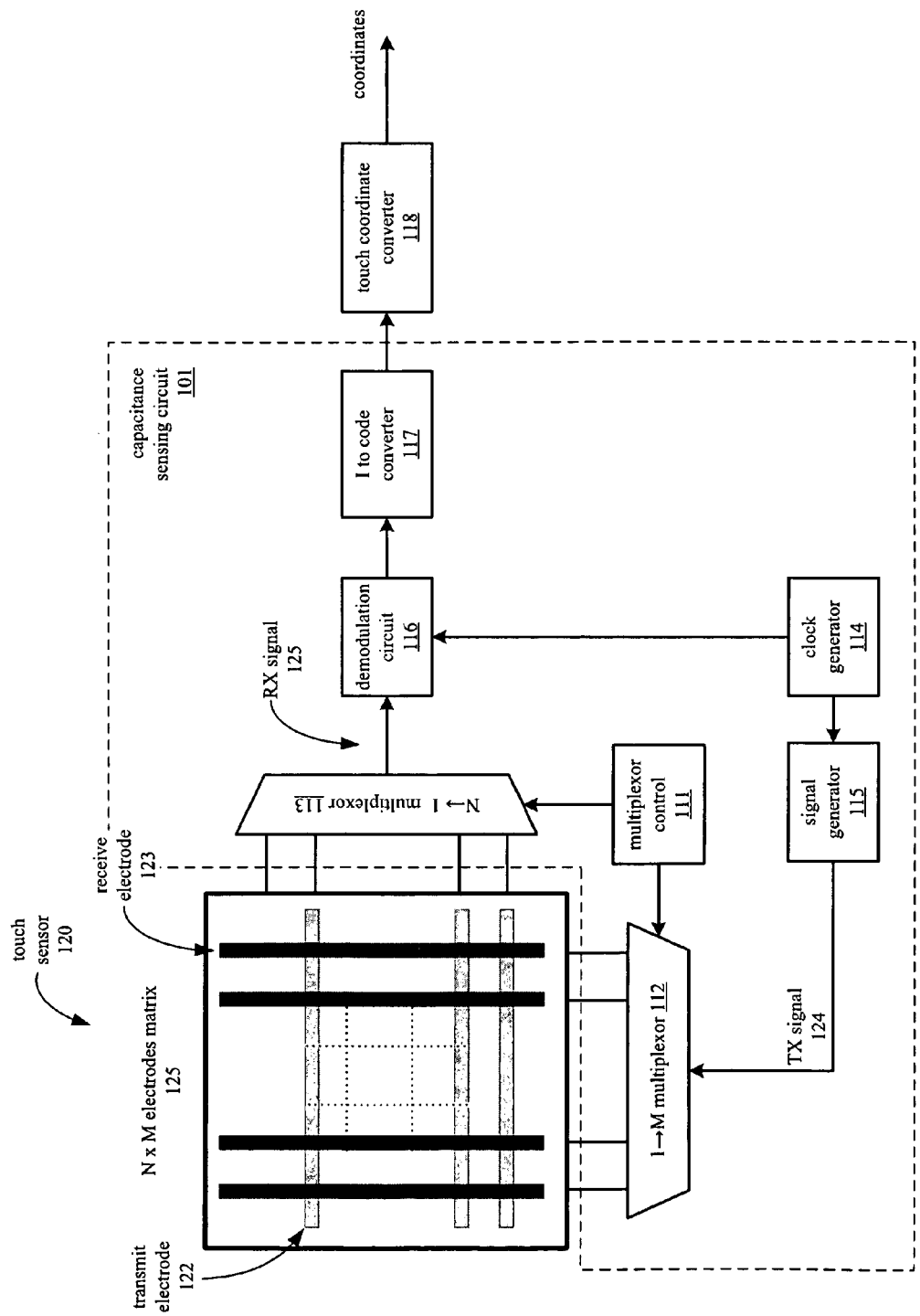
FIG. 1B illustrates a block diagram of one embodiment of a device for detecting an input and a location of the input on a touchpad.

FIG. 1B is a block diagram illustrating one embodiment of a TX-RX capacitive touchpad sensor and a capacitance sensing circuit that converts measured capacitances to touchpad coordinates. Touch sensor 120 includes a matrix 125 of N×M electrodes (N receive electrodes and M transmit electrodes), which further includes transmit (TX) electrode 122 and receive (RX) electrode 123. Each of the electrodes in matrix 125 is connected with capacitance sensing circuit 101 through multiplexors 112 and 113. Capacitance sensing circuit 101 includes multiplexor control 111, multiplexors 112 and 113, clock generator 114, signal generator 115, demodulation circuit 116, and current to code (I to code) converter 117. Current to code converter 117 is further coupled with touch coordinate converter 118.

The transmit and receive electrodes in the electrode matrix 125 are arranged so that each of the transmit electrodes intersects each of the receive electrodes. Thus, each transmit electrode is capacitively coupled with each of the receive electrodes. For example, transmit electrode 122 is capacitively coupled with receive electrode 123 at the point where transmit electrode 122 and receive electrode 123 intersect.

Clock generator 114 supplies a clock signal to signal generator 115, which produces a TX signal 124 to be supplied to the transmit electrodes of touch sensor 120. In one embodiment, the signal generator 115 includes a set of switches that operate according to the clock signal from clock generator 114. The switches may generate a TX signal 124 by periodically connecting the output of signal generator 115 first to a supply voltage and then to ground.

The output of signal generator 115 is connected with multiplexor 112, which allows the TX signal 124 to be applied to any of the M transmit electrodes of touch sensor 120. In one embodiment, multiplexor control 111 controls multiplexor 112 so that the TX signal 124 is applied to each transmit electrode in sequence. Multiplexor 112 may also be used to ground the other transmit electrodes to which the TX signal 124 is not currently being applied.

Because of the capacitive coupling between the transmit and receive electrodes, the TX signal 124 applied to each transmit electrode induces a current at each of the receive electrodes. For instance, when the TX signal 124 is applied to transmit electrode 122 through multiplexor 112, the TX signal 124 induces an RX signal 125 on the receive electrodes in matrix 125. The RX signal 125 on each of the receive electrodes can then be measured in sequence by using multiplexor 113 to connect each of the N receive electrodes to demodulation circuit 116 in sequence.

The capacitance associated with each intersection between a TX electrode and an RX electrode can be sensed by selecting every available combination of TX electrode and an RX electrode using multiplexors 112 and 113.

When an object, such as a finger, approaches the electrode matrix 125, the object causes a decrease in capacitance affecting only some of the electrodes. For example, if a finger is placed near the intersection of transmit electrode 122 and receive electrode 123, the presence of the finger will decrease the capacitance between the two electrodes 122 and 123. Thus, the location of the finger on the touchpad can be determined by identifying both the receive electrode having a decreased capacitance and the transmit electrode to which the TX signal 124 was applied at the time the decreased capacitance was measured on the receive electrode.

Thus, by sequentially determining the capacitances associated with each intersection of electrodes in the matrix 125 the locations of one or more inputs can be determined.

The induced current waveform 125 is rectified by demodulation circuit 116. The rectified current output by demodulation circuit 116 can then be filtered and converted to a digital code by I to code converter 117. The digital code is converted to touch coordinates indicating a position of an input on touch sensor pad by touch coordinate converter 118.

Figure 2A:
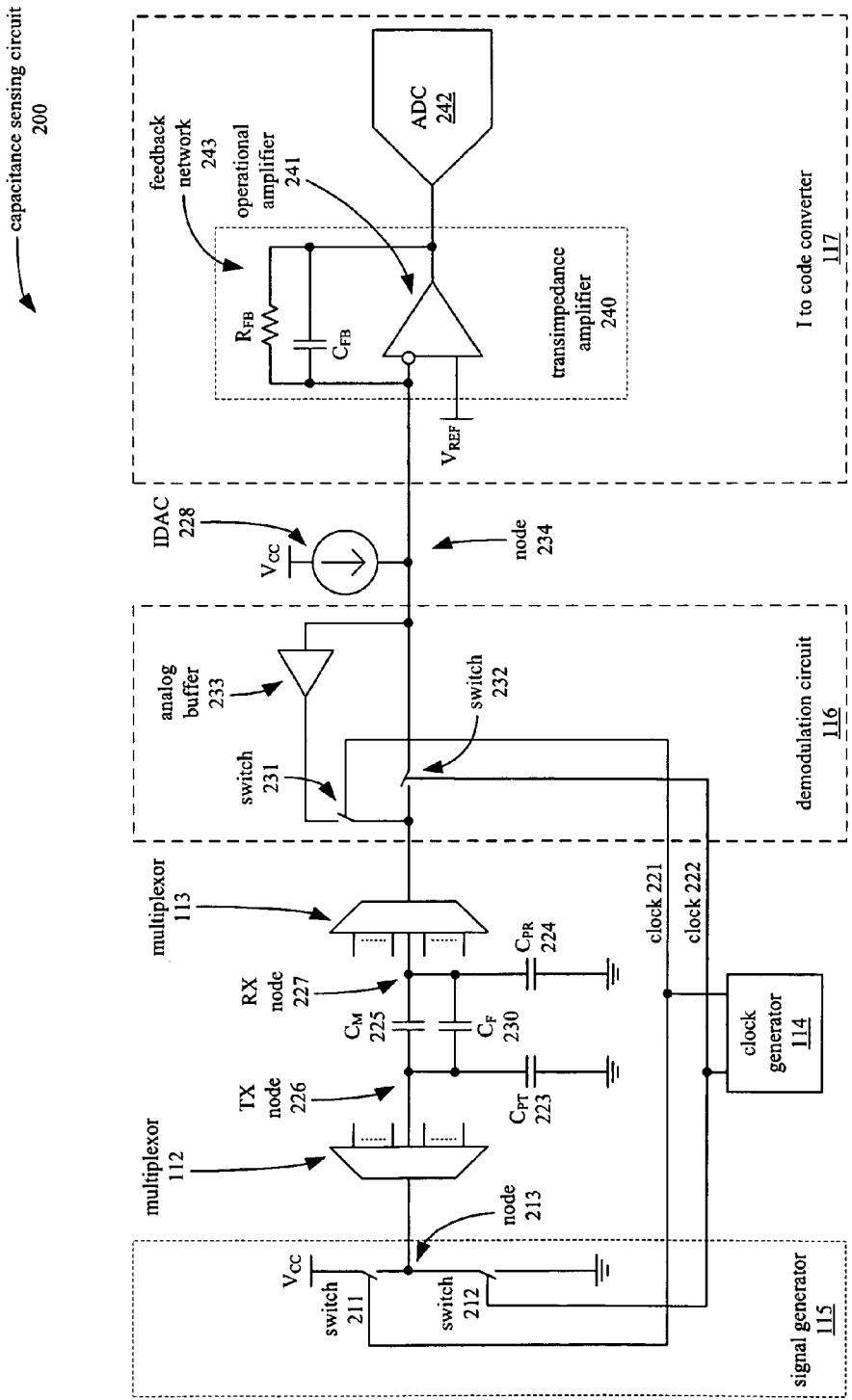
FIG. 2A illustrates one embodiment of a circuit for detecting an input at a capacitive sensor while compensating for parasitic and mutual capacitance of capacitive sensor elements.

FIG. 2A illustrates one embodiment of a capacitance sensing circuit that includes a compensation circuit for minimizing effects of parasitic and mutual capacitance. Capacitance sensing circuit 200 includes multiplexors 112 and 113, clock generator 114, signal generator 115, demodulation circuit 116, and current to code (I to code) converter 117. Signal generator 115 includes switches 211 and 212. Demodulation circuit 116 includes switches 231 and 232, and analog buffer 233. I to code converter 117 includes transimpedance amplifier (TIA) 240 and analog to digital converter (ADC) 242. TIA 240 includes an operational amplifier 241 and feedback network 243.

Clock generator 114 provides two different clock signals, clock 221 and clock 222, to signal generator 115. In one embodiment, the clock 221 and clock 222 signals are non-overlapping signals, so that the clock 221 and clock 222 signals are never simultaneously asserted. Signal generator 115 includes switches 211 and 212, which are controlled by the clock 221 and clock 222 signals, respectively. Thus, switches 211 and 212 operate in a non-overlapping manner to alternately connected node 213 first to supply voltage $V_{CC}$ and then to ground. This generates a TX signal on node 213 that oscillates between $V_{CC}$ and ground.

Multiplexor 112 applies the TX signal to TX node 226. TX node 226 may be one of many transmit nodes connected to multiplexor 112. For example, with reference to FIG. 1B, TX node 226 may represent one of the transmit electrodes in electrode matrix 125, such as transmit electrode 122. TX node 226 is capacitively coupled to ground through parasitic capacitance $C_{PT}$ 223, and is capacitively coupled to RX node 227 through mutual capacitance $C_M$ 225.

The TX signal applied to TX node 226 induces a corresponding signal on RX node 227 because of the capacitive coupling between TX node 226 and RX node 227. In one embodiment, RX node 227 may be one of many receive electrodes selectable using multiplexor 113. For example, referring to FIG. 1B, RX node 227 may be one of the receive electrodes in electrode matrix 125, such as receive electrode 123. RX node 227 is capacitively coupled to ground through parasitic capacitance $C_{PR}$ 224.

Figure 2B:
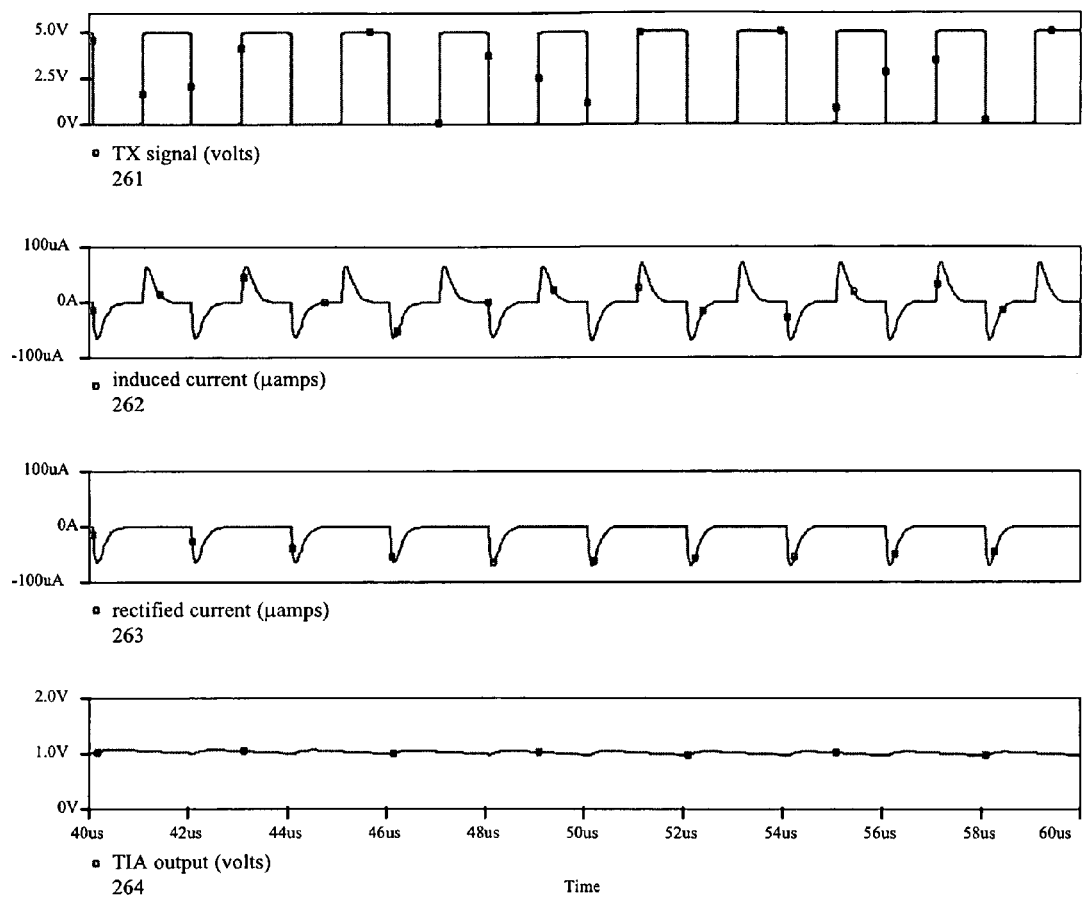
FIG. 2B illustrates voltage and current waveforms describing the operation of one embodiment of a capacitance sensing circuit.

FIG. 2B illustrates voltage and current waveforms describing the operation of one embodiment of a capacitance sensing circuit, such as capacitance sensing circuit 200. With reference to FIG. 2B, the TX signal waveform 261 corresponds to the signal at node 213 that is applied to TX node 226 through multiplexor 112. The induced current waveform 262 describes the current that is induced at RX node 227 by TX signal 261, due to capacitive coupling between TX node 226 and RX node 227.

The induced current 262 is applied to the input of the demodulation circuit 116. Demodulation circuit 116 rectifies the induced current 262 using switches 231 and 232 and analog buffer 233. Switches 231 and 232 are operated in a non-overlapping manner using the clock 221 and clock 222, respectively. Thus, switches 231 and 232 are not simultaneously closed at any point in the switching cycle. When switch 231 is closed, analog buffer 233 is connected to RX node 227 through multiplexor 113, and maintains a constant voltage at RX node 227. In one embodiment, the analog buffer 233 is a unity gain amplifier. The input of analog buffer 233 is connected to node 234, which is driven to $V_{REF}$ by operational amplifier 241. Thus, the analog buffer 233 maintains the voltage level $V_{REF}$ at RX node 227 while switch 231 is closed.

Since switches 231 and 211 are both controlled using the clock 221 signal, the time period during which switch 231 is closed coincides with the time during which TX node 226 is connected to $V_{CC}$. During this time period, current flows out of RX node 227 due to the voltage rise of the TX signal from ground to $V_{CC}$.

Since switches 232 and 212 are both controlled by the clock 222 signal, switch 232 is closed during the time that TX node 226 is connected to ground. During this time, current flows into RX node 227 due to the drop in voltage at TX node 226.

When switch 232 is closed, switch 231 is open and analog buffer 233 is disconnected from RX node 227. During this time period, RX node 227 is connected with node 234 through multiplexor 113. Since current is flowing into RX node 227 during this time, current is drawn out of node 234 through the closed switch 232.

The demodulation circuit thus performs as a half-wave rectifier for the negative current peaks in the induced current 262. Referring to FIG. 2B, the rectified current 263 corresponds to the rectified signal at node 234.

The rectified current 263 is applied to the input of current to code converter 117. Current to code converter 117 receives a current as input and outputs a digital code corresponding to the input current. Thus, the converter 117 converts the rectified current 263 to a digital code that, like the rectified current 263, depends on the capacitance between the TX node 226 and the RX node 227. The digital code corresponding to this measured capacitance can then be processed by a computer or other circuit.

The current to code converter 117 converts the rectified current 263 to a digital code using a transimpedance amplifier (TIA) 240 and an analog to digital converter (ADC) 242. The TIA 240 converts the current 263 into a voltage, and the ADC 242 converts the voltage into a digital code. Node 234, into which the current 263 flows, is connected to an inverting input of operation amplifier 241, which has its output connected to the inverting input through feedback network 243. Operational amplifier 241 maintains the voltage at its inverting input to be approximately equal to the voltage $V_{REF}$ applied to its non-inverting input by driving its output to a particular voltage level. This TIA output voltage level 264 is converted to a digital code by the ADC 242.

When an input is received at the capacitive sensor, the capacitance between TX node 226 and RX node 227 changes. For example, nodes 226 and 227 may be electrodes in an electrode matrix 125. A finger touch near nodes 226 and 227 may shunt to ground part of the electric field produced by the TX signal 261 at TX node 226. Thus, the effect of the finger touch is to decrease the capacitance between the TX and RX nodes 226 and 227.

A change in capacitance due to an input at the capacitive sensor can be modeled by capacitor $C_F$ 230 in parallel with mutual capacitance $C_M$ 225 between TX node 226 and RX node 227. Since the presence of an input decreases the capacitance between TX node 226 and RX node 227, $C_F$ 230 has a negative value. Physically, the negative value of $C_F$ means that the cumulative mutual capacitance is reduced at touch due to the shunting of part of the electric field to ground.

When a conductive object, such as a finger, approaches TX node 226 and RX node 227, the capacitance between these nodes 226 and 227 decreases, which means that the capacitive coupling between the nodes 226 and 227 decreases. Accordingly, the magnitude of the current induced at RX node 227 due to TX signal 261 is decreased. The decreased induced current waveform is rectified and converted to a voltage by TIA 240, as described above. The decrease in the resulting voltage may be converted to a digital code and detected as an input.

The change in capacitance $C_F$ due to an input may be small relative to the baseline capacitance (resulting from $C_M$ 225 and the parasitic capacitances $C_{PT}$ 223 and $C_{PR}$ 224). Therefore, the corresponding decrease in voltage due to an input may likewise be small. For example, the baseline capacitance between nodes 226 and 227, as measured when no input is present, may be on the order of 3.0 pF. An object near the nodes 226 and 227 may only decrease the capacitance a few percent to 2.9 pF.

Since the change in capacitance $C_F$ is small as compared to the baseline capacitance, the decrease in voltage due to an input is correspondingly small as compared to the baseline voltage that is produced when no input is present at the capacitive sensor electrodes. Therefore, when the voltage is converted to a digital code capable of resolving a finite number of levels, only a relatively small number of these levels may correspond to the dynamic range of the voltage change due to the input.

This effect of the baseline capacitance can be removed by using a compensation circuit that adds a compensation current to the rectified current output from demodulation circuit 116. The compensation current can be used to cancel the portion of the rectified current that is attributable to the baseline capacitance.

In one embodiment, the compensation circuit includes a current digital to analog converter (IDAC) 228, which is configured to supply a compensation current into node 234. In one embodiment, IDAC 228 is a programmable IDAC for which an output compensation current can be selected from a range of available current levels.

In one embodiment, a switched capacitor may be used to supply the compensation current. For example, the negative electrode of the switched capacitor may be connected to ground while the positive electrode is alternately switched between a supply voltage and node 234. The switching frequency can then be adjusted to control the level of the compensation current.

When no input is present at the capacitive sensor, the baseline capacitance of the sensor causes a baseline rectified current out of node 234. IDAC 228 cancels the effect of the baseline capacitance by adding a level of compensation current to minimize the net flow of current into or out of node 234.

When a conductive object approaches the TX and RX nodes 226 and 227, the compensation current can be added to the resulting rectified current using IDAC 228 to produce a compensated current waveform. The compensated current waveform is applied to the input of TIA 240.

With the effect of the baseline capacitance minimized, the change in capacitance $C_F$ due to an input results in a greater decrease in voltage at the output of TIA 240. The compensation circuit thus improves utilization of the dynamic range of the ADC 242.

In one embodiment, the compensated current waveform is filtered using feedback network 243 to reduce the ripple of the voltage output by TIA 240 before applying it to the input of ADC 242. In one embodiment, feedback network 243 may be an RC network including a feedback resistor $R_{FB}$ and a feedback capacitor $C_{FB}$.

In one embodiment the compensation signal source can be connected before demodulation switches 231 and 232 directly to the output of multiplexer 113.

In one embodiment, the above measurement and compensation process is performed for each pair of transmit and receive electrodes in matrix 125.

Figure 3:
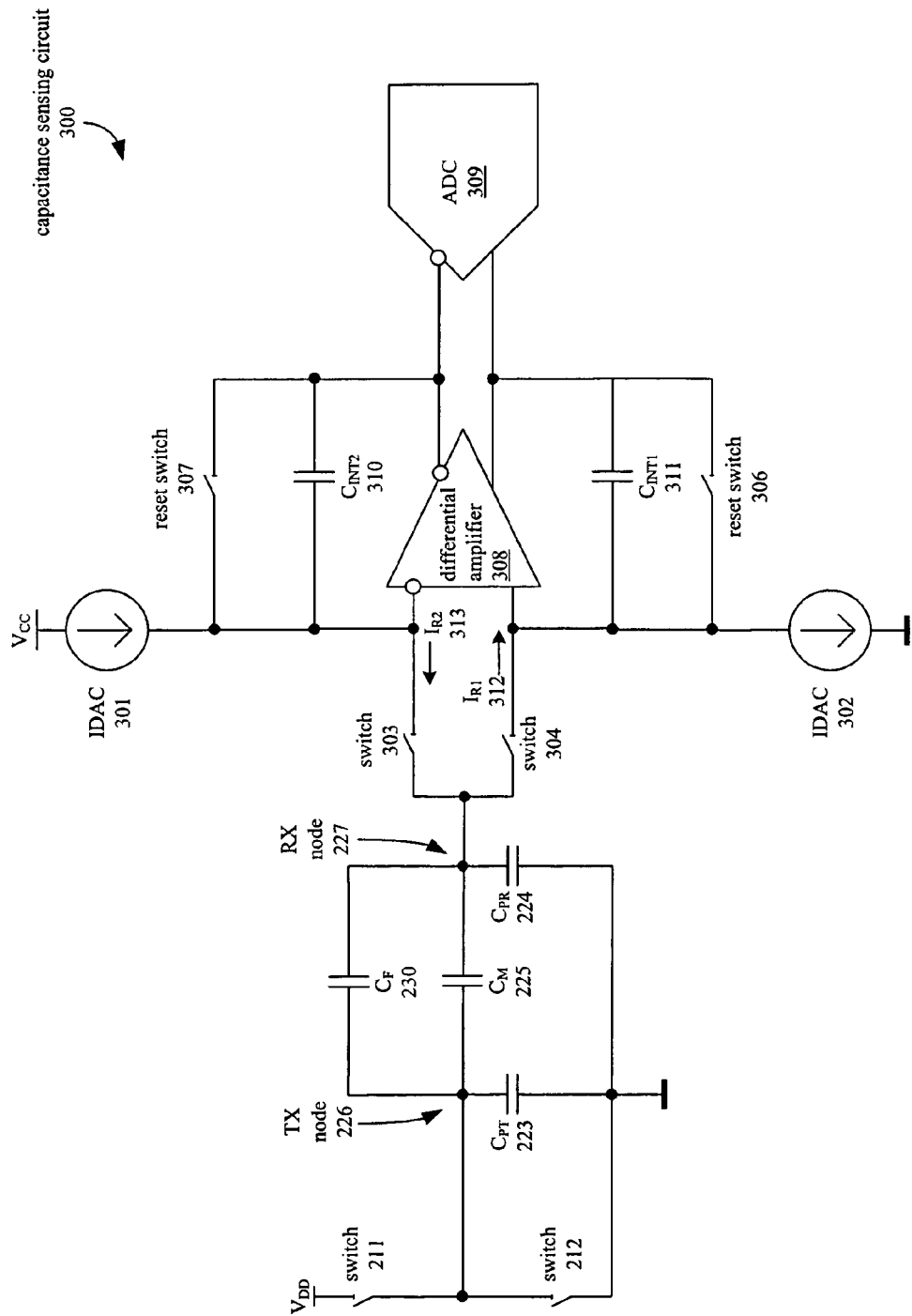
FIG. 3 illustrates one embodiment of a circuit for detecting the magnitude and location of an input while compensating for parasitic and mutual capacitance of capacitive sensor elements.

FIG. 3 illustrates compensation of the baseline capacitance in a capacitance sensing circuit 300 that performs a full wave rectification of the induced current waveform flowing out of RX node 227, according to one embodiment. Capacitance sensing circuit 300 includes IDACs 301 and 302, rectification switches 303 and 304, reset switches 306 and 307, integration capacitors 310 and 311, differential amplifier 308, and analog to digital converter (ADC) 309.

The full wave rectification performed by capacitance sensing circuit 300 improves the immunity of the circuit 300 to low frequency noise, such as noise caused by AC power line or mains voltages. For example, parasitic charge accumulated in the sensor electrodes due to a 60 Hz AC mains voltage change during one phase is balanced by an opposite charge accumulated during the next phase.

In capacitive sensing circuit 300, the induced current flowing out of RX node 227 is rectified by the operation of switches 303 and 304. In one embodiment, switches 303 and 212 are controlled by a first clock signal, while switches 304 and 211 are controlled by a second clock signal that is non-overlapping with respect to the first clock signal. Thus, switches 303 and 304 operate in a non-overlapping manner to rectify both the positive and negative portions of the induced current flowing out of node 227.

For example, when switch 304 is closed, switch 303 is open and switch 211 is closed. Switch 211 connects TX node 226 with $V_{DD}$. The increase in voltage at TX node 226 causes a flow of current out of RX node 227 due to the capacitive coupling between nodes 226 and 227. The induced current flowing out of RX node 227 is supplied through closed switch 304 to the node connected to the non-inverting input of differential amplifier 308.

When switch 303 is closed, switch 304 is open and switch 212 is closed. Switch 211 connects TX node 226 with ground. The decrease in voltage at TX node 226 causes a flow of current into RX node 227 due to the capacitive coupling between nodes 226 and 227. The induced current flowing into RX node 227 is drawn through closed switch 303 from the node connected to the inverting input of differential amplifier 308.

Thus, a first rectified current $I_{R1}$ 312 flows into the non-inverting input node of differential amplifier 308 and a second rectified current $I_{R2}$ 313 flows out of the inverting input node of differential amplifier 308. IDACs 302 and 301 supply compensation currents at levels that minimize the current flow into and out of these nodes when no input is present. Specifically, IDAC 301 supplies a compensation current into the inverting input node to cancel the current $I_{R2}$ 313 flowing out of the node. IDAC 302 draws a compensation current out of the non-inverting input node to cancel the current $I_{R1}$ 312 flowing into the node.

Differential amplifier 308 and integration capacitors 310 and 311 function together as a differential integrator. Integration capacitors 310 and 311 are used to integrate charge resulting from the net flow of current into or out of the input nodes of differential amplifier 308, allowing a potential difference to build up between the inputs of differential amplifier 308 over the duration of an integration period. Based on this potential difference, differential amplifier 308 outputs a voltage to ADC 309, which converts the voltage to a digital code. Reset switches 306 and 307 can be closed to discharge capacitors 311 and 310 in preparation for a subsequent integration period.

Figure 4:
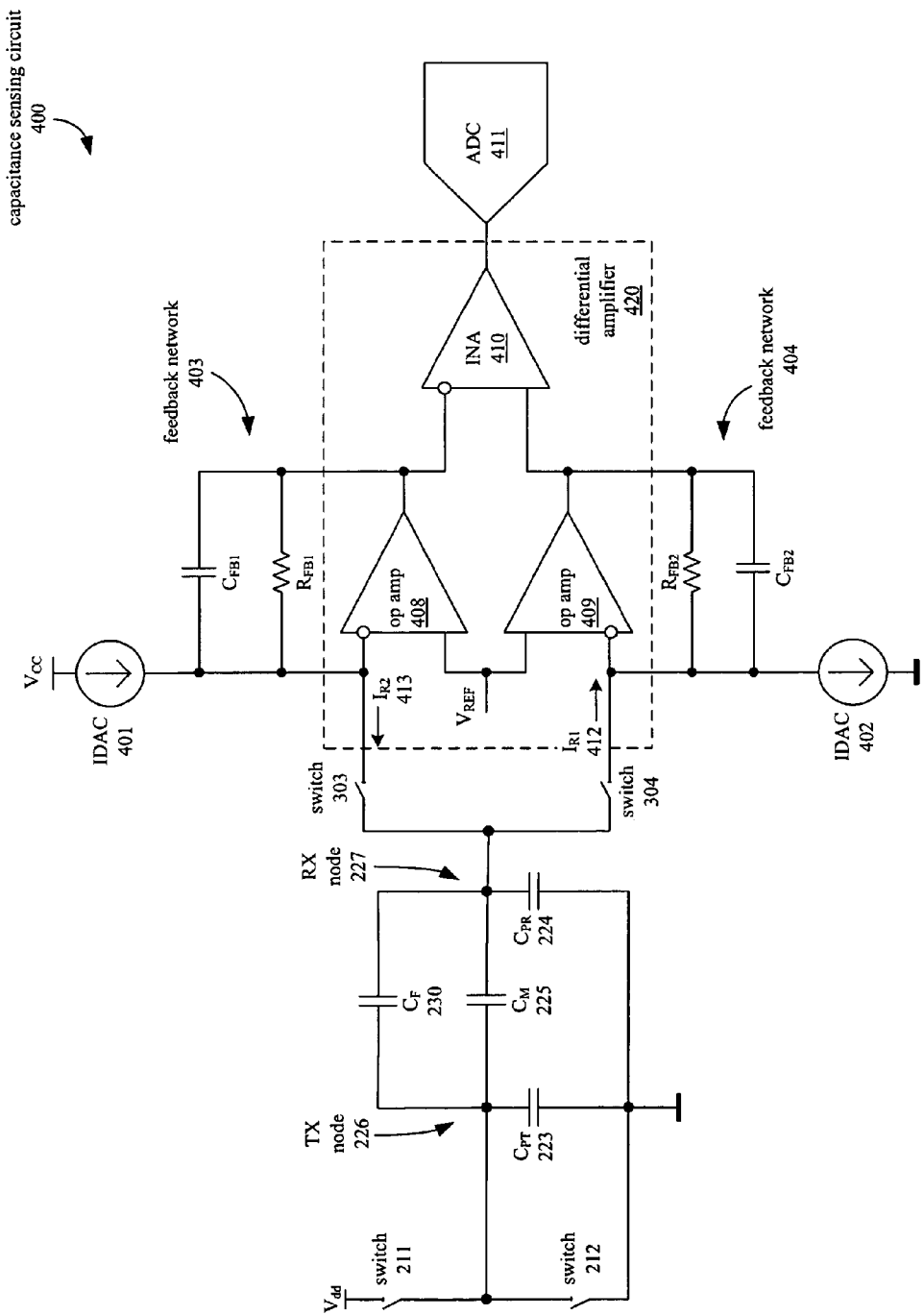
FIG. 4 illustrates one embodiment of a circuit for detecting the magnitude and location of an input while compensating for parasitic and mutual capacitance of capacitive sensor elements.

FIG. 4 illustrates compensation of the baseline capacitance in a capacitance sensing circuit 400 that performs a full wave rectification of the induced current waveform flowing out of RX node 227, according to one embodiment. Capacitance sensing circuit 400 includes a differential amplifier 420. Differential amplifier 420 includes operational amplifiers 408 and 409, and instrumentation amplifier (INA) 410. Operational amplifiers 408 and 409 are connected to feedback networks 403 and 404, respectively. The input nodes of differential amplifier 420 are supplied with compensation currents from IDACs 401 and 402.

In capacitance sensing circuit 400, the induced current flowing out of RX node 227 is rectified by the operation of switches 303 and 304, as previously described with reference to FIG. 3. Thus, a first rectified current $I_{R1}$ 412 flows into the inverting input node of operational amplifier 409 and a second rectified current $I_{R2}$ 413 flows out of the inverting input node of operation amplifier 408. IDACs 402 and 401 supply compensation currents at levels that minimize the current flow into and out of these nodes when no input is present. Specifically, IDAC 401 supplies a compensation current into the inverting input node of operation amplifier 408 to cancel the current $I_{R2}$ 413 flowing out of the node. IDAC 402 draws a compensation current out of the inverting input node of operation amplifier 409 to cancel the current $I_{R1}$ 412 flowing into the node.

Operational amplifiers 408 and 409 of differential amplifier 420 drive their outputs to sufficient voltage levels to maintain their inverting inputs near reference voltage $V_{REF}$, which is applied to the non-inverting inputs of operational amplifiers 408 and 409. The output voltages of operational amplifiers 408 and 409 are filtered to reduce their ripple voltages. In one embodiment, the filtering is performed using feedback networks 403 and 404, which may include feedback capacitors $C_{FB1}$ and $C_{FB2}$ and feedback resistors $R_{FB1}$ and $R_{FB2}$.

The output voltages of operational amplifiers 408 and 409 are applied to the inverting and non-inverting inputs of instrumentation amplifier (INA) 410. Based on these voltages, INA 410 generates an output voltage, which is converted to a digital code by ADC 411.

Figure 5:
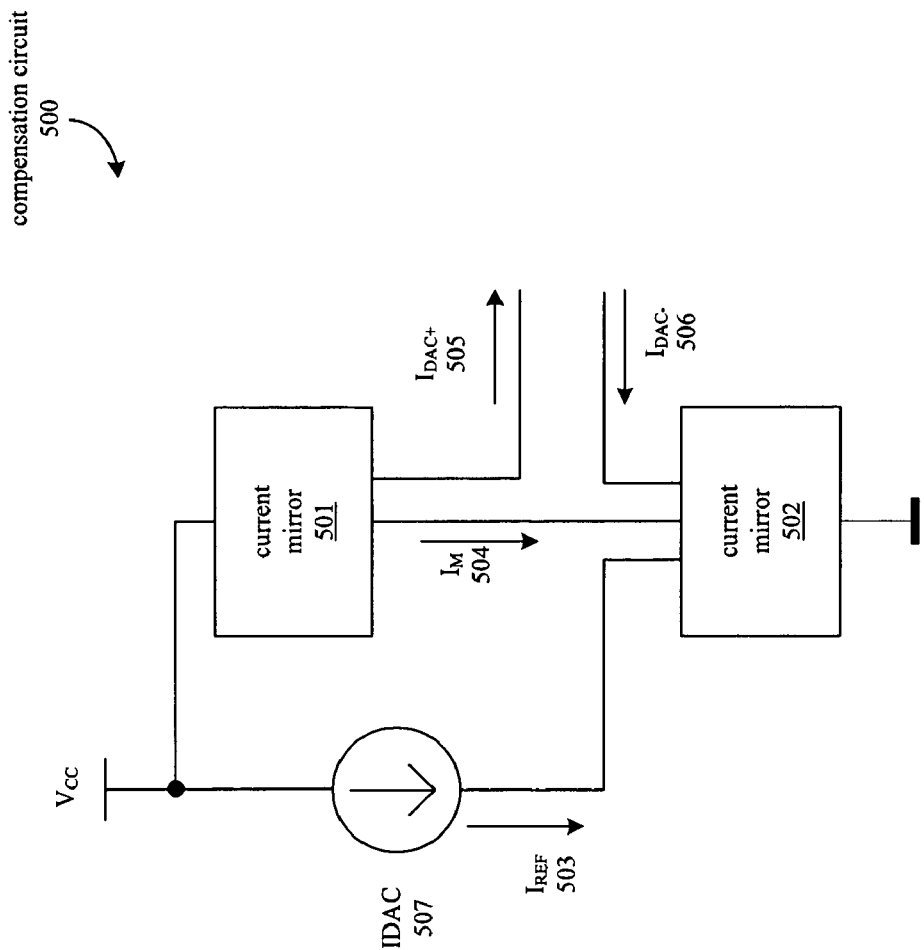
FIG. 5 illustrates one embodiment of a circuit for supplying a compensation current to a capacitance sensing circuit.

FIG. 5 illustrates one embodiment of a compensation circuit 500 for generating compensation currents using a single IDAC 507. Compensation circuit 500 includes current mirrors 501 and 502 and IDAC 507.

IDAC 507 supplies a reference current $I_{REF}$ 503 to current mirror 502. Current mirror 502 mirrors current $I_{REF}$ 503 and generates currents $I_M$ 504 and $I_{DAC-}$ 506, which are approximately equal to $I_{REF}$ 503. Current $I_M$ is further mirrored by current mirror 501, which generates current $I_{DAC+}$ 505, which is approximately equal to $I_M$. The currents $I_{DAC+}$ 505 and $I_{DAC-}$ 506 can be used as compensation currents for a capacitance sensing circuit with full wave rectification, such as capacitance sensing circuit 300 or 400.

Figure 6:
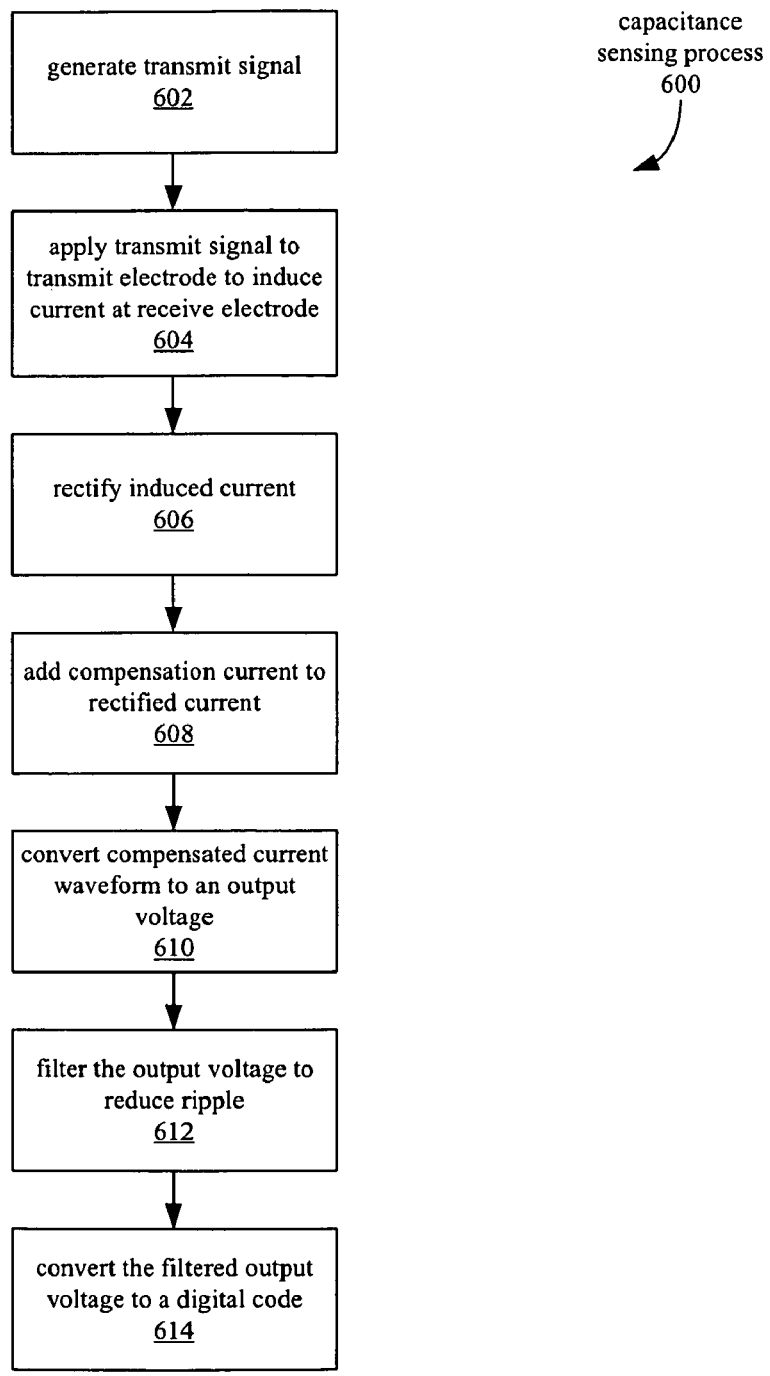
FIG. 6 is a flow chart illustrating a process for compensating for parasitic and mutual capacitances of sensor elements in a capacitance sensing circuit, according to one embodiment.

FIG. 6 is a flow diagram illustrating a process for sensing capacitance of a capacitive sensor, according to one embodiment. Capacitance sensing process 600 may be implemented, for example, by capacitance sensing circuits 200, 300, and 400.

At block 602, a transmit signal may be generated. In one embodiment, the transmit signal may be similar to TX signal 261, which can be generated by switching a node to which the transmit signal is applied between a supply voltage $V_{CC}$ and ground.

At block 604, the transmit signal may be applied to a transmit electrode to induce a current at a receive electrode that is capacitively coupled with the transmit electrode. For example, in capacitance sensing circuit 200, TX signal 261 may be applied to TX node 226 to induce a current flowing into or out of RX node 227. The induced current waveform generated may include positive and negative peaks, corresponding to current flowing into and out of the receive electrode.

At block 606, the induced current waveform may be rectified. In one embodiment, the rectification may be performed using switches, such as switches 231 and 232, that are operated synchronously with the switching used to generate the transmit signal. In one embodiment, the induced current waveform is rectified using a half wave rectifier, such as demodulation circuit 116 in capacitance sensing circuit 200. Alternatively, the rectification may be a full wave rectification, as implemented in capacitance sensing circuits 300 or 400.

At block 608, a compensation current may be added to the rectified current. For example, in capacitance sensing circuit 200, IDAC 228 adds a compensation current to the rectified current flowing out of node 234. In one embodiment, the magnitude of the compensation current is approximately equal to the magnitude of the baseline rectified current. IDAC 228 supplies the compensation current into node 234 to compensate for the baseline rectified current flowing out of node 234.

At block 610, the compensated current waveform may be converted to an output voltage. In one embodiment, this conversion is performed by a transimpedance amplifier (TIA). For example, in capacitance sensing circuit 200, the compensated current waveform is converted to a voltage by TIA 240.

Alternatively, the conversion may be performed by a differential integrator, such as the differential integrator of capacitance sensing circuit 300 that includes differential amplifier 308 and capacitors 310 and 311, or a differential amplifier such as differential amplifier 420 of capacitance sensing circuit 400.

At block 612, the output voltage may be filtered to reduce ripple in the output voltage. The output voltage may be characterized by a significant amount of ripple if it is generated from a current induced by a transmit signal including a series of pulses. For example, TX signal 261, when applied to a transmit electrode, causes a rectified current 263 with corresponding periodic pulses. This rectified current, if converted to a voltage without filtering, will result in an output voltage characterized by a significant ripple voltage. Thus, in one embodiment, filtering may be performed by a feedback network such as feedback network 243 connected to the output of operational amplifier 241. In alternative embodiments, the filtering may be performed by integration capacitors, such as $C_{INT1}$ 311 and $C_{INT2}$ 310 of capacitance sensing circuit 300, or by feedback networks 403 and 404 of capacitance sensing circuit 400. The filtering reduces ripple in the output voltage generated from the rectified current. For example, TIA output 264 is output from TIA 240 and is characterized by a smaller ripple voltage than would be produced without filtering.

At block 614, the filtered output voltage can be converted to a digital code. In one embodiment, the conversion of the output voltage to the digital code may be performed by an analog to digital converter (ADC), such as ADC 242 of capacitance sensing circuit 200, ADC 309 of capacitance sensing circuit 300, or ADC 411 of capacitance sensing circuit 400. In one embodiment, the output voltage may be represented by the density of asserted bits in an output bitstream. Alternatively, the level of the output voltage may be represented by a binary coding. The digital code can be processed by a computer system or other circuit.

In one embodiment, the operations represented in blocks 602-614 may be performed continuously during the operation of a capacitance sensing circuit in which they are implemented, so that inputs to the capacitive sensor can be tracked continuously. For example, if the capacitive sensor is an electrode matrix such as electrode matrix 125, the capacitance sensing circuit may track the position of finger causing an input over time. In alternative embodiments, the operations of capacitance sensing process 600 may be performed periodically.

Figure 7A:
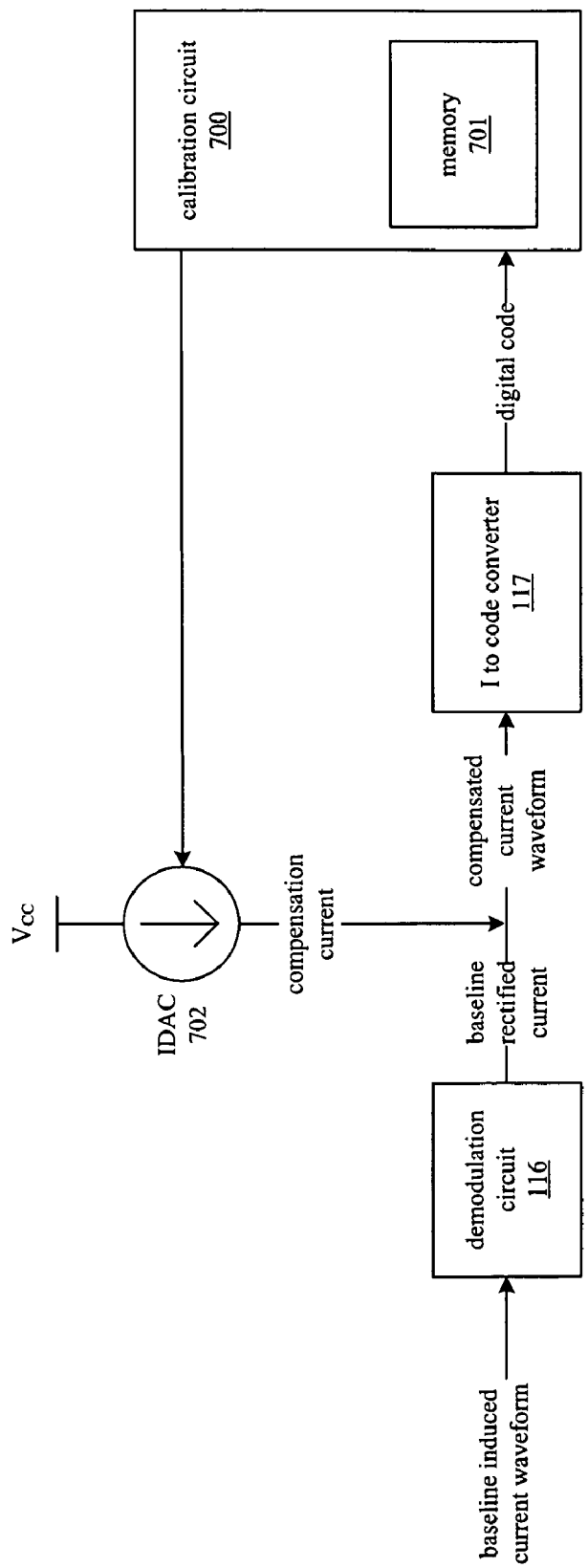
FIG. 7A is a block diagram illustrating one embodiment of a calibration circuit for calibrating a compensation circuit.

FIG. 7A illustrates a block diagram of one embodiment of a calibration circuit for calibrating a compensation circuit. The calibration circuit and compensation circuit can be used in a capacitive sensing circuit, such as capacitive sensing circuits 200, 300, or 400. Calibration circuit 700 may be used to set an appropriate compensation current to be output by the compensation circuitry, represented by IDAC 702. In one embodiment, the calibration circuit 700 determines a compensation current that is approximately equal to the baseline rectified current output by demodulation circuit 116. The baseline rectified current is the rectified current output by the demodulation circuit 116 when no input is present at the capacitive sensor.

In one embodiment, calibration circuit 700 may calibrate the IDAC 702 when no input is present so that the calibration circuit 700 can measure the baseline rectified current. For example, if the calibration circuit 700 used with a capacitance sensing circuit and capacitive sensor in a user interface device, the calibration process may be performed at a time during which the user is instructed not to touch the capacitive sensor, or at a time when inputs to the capacitive sensor are expected not to occur. During this time, a baseline induced current waveform from a receive electrode is rectified by the demodulation circuit to generate a baseline rectified current, according to one embodiment. The baseline rectified current is converted to a digital code by current to code (I to code) converter 117 and transmitted to the calibration circuit 700.

The digital code can then be processed by the calibration circuit 700. For example, the digital code received by the calibration circuit 700 may include a sequence of digitally coded voltage levels, which may be averaged over time by the calibration circuit. The calibration circuit 700 may also perform other operations on the digital code, such as adding or subtracting an offset, or filtering.

Based on the processed digital code, the calibration circuit determines a compensation current level to be output by IDAC 702 and stores a value representing this level in memory 701. In one embodiment, the calibration circuit 700 stores in memory 701 a compensation current level that is approximately equal to an average of the baseline rectified current detected during the calibration process.

In one embodiment, the compensation current, when output by IDAC 702, is more likely to accurately cancel the baseline rectified current, since the compensation current level is based on an empirically determined baseline rectified current.

During normal operation of the capacitive sensing circuit (i.e., the capacitive sensing circuit is detecting inputs at a capacitive sensor), the calibration circuit 700 may access the memory 701 to determine the level of compensation current to be output by the IDAC 702. The calibration circuitry controls IDAC 702 to cause the IDAC 702 to output this level of compensation current.

In one embodiment, the calibration circuit 700 and compensation circuit, represented by IDAC 702, are implemented in a capacitance sensing circuit that measures capacitances of a number of sensor elements. For example, the capacitance sensing circuit may be configured to measure capacitances between each pair of transmit and receive electrodes in an electrode matrix, such as matrix 125. For such embodiments, the calibration circuit may perform a calibration process for each possible pair of a transmit and a receive electrode. For example, if an electrode matrix includes 20 transmit electrodes and 30 receive electrodes, the calibration process would be performed 20×30 times, or 600 times. Thus, the calibration process is performed once for each possible pair of transmit and receive electrodes. The 600 resulting compensation current levels can be stored in the memory 701. During normal operation of the capacitance sensing circuit, the compensation current level associated with a particular pair of a transmit and a receive electrode can be retrieved from the memory and used to cancel the baseline rectified current produced when the capacitance of that particular pair is being sensed.

Figure 7B:
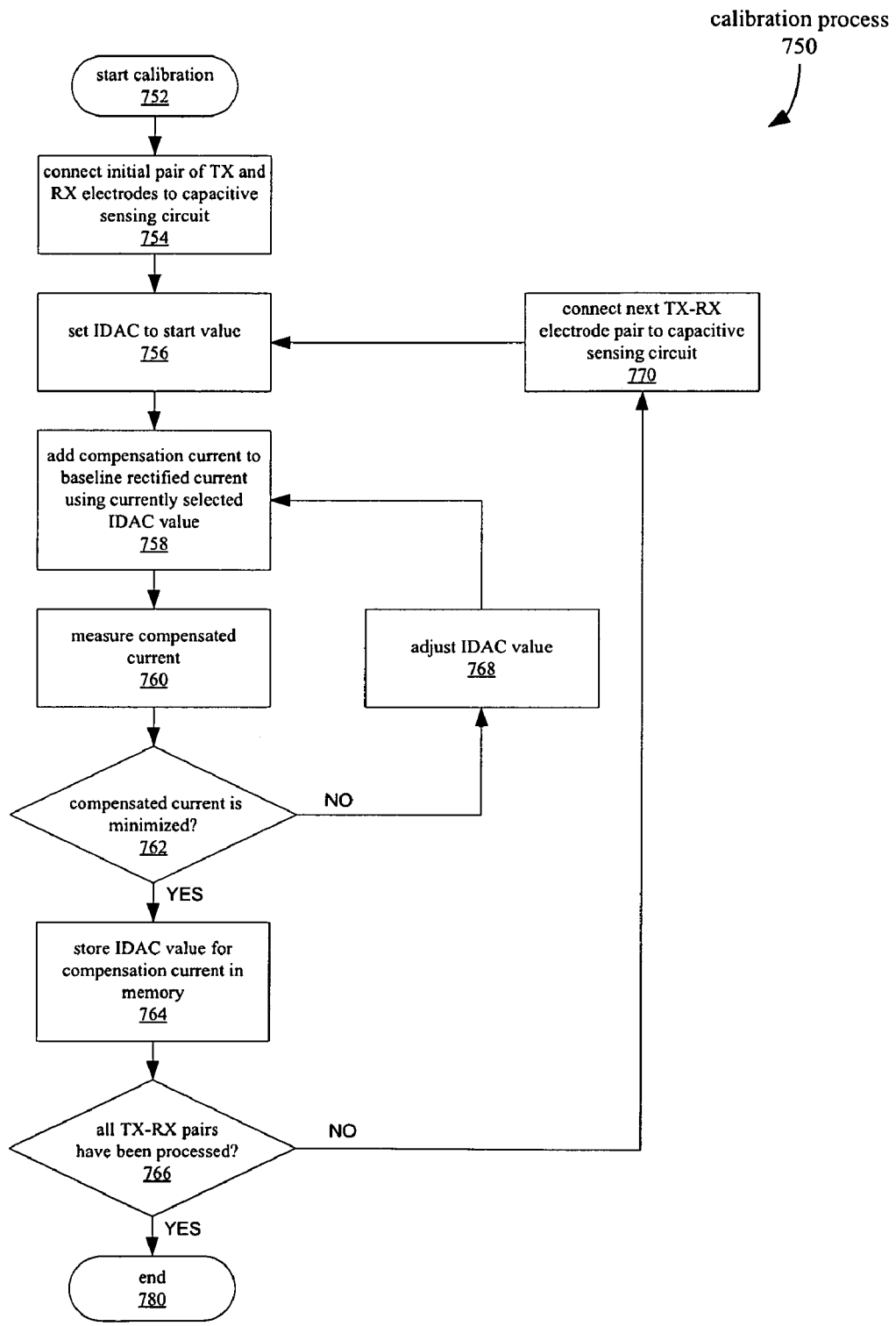
FIG. 7B is a flow chart illustrating a process for calibrating a compensation current in a capacitance sensing circuit, according to one embodiment.

FIG. 7B is a flow chart illustrating a process for calibrating compensation circuitry for use in a capacitive sensing circuit. The operations of calibration process 750 may be performed by calibration circuit 700.

The calibration process may begin at block 752, and continue at block 754. At block 754, the initial pair of transmit and receive electrodes may be connected to the capacitive sensing circuit. For example, in capacitive sensing circuit 101, multiplexor control 111 may be used to control multiplexor 112 to connect the initial transmit electrode to the signal generator 115 and to control multiplexor 113 to connect the initial receive electrode to demodulation circuit 116.

At block 756, an IDAC used as a compensation circuit may be set to a start value. In one embodiment, the IDAC is a programmable IDAC for which an output current can be set by storing a digital value in a register of the IDAC. In one embodiment, the compensation circuitry may use a current source such as a switched capacitor, where the switching frequency can be adjusted to set the current output.

At block 758, the IDAC may be used to add a current, according to its currently set value, to the baseline rectified current. For example, in capacitance sensing circuit 200, the IDAC 228 supplies a compensation current into node 234. Since the baseline rectified current is drawn out of node 234, the compensation current supplied by the IDAC 228 is added to the baseline rectified current. For example, the baseline rectified current may be drawn out of node 234 and the compensation current may be supplied into node 234, reducing the net current drawn out of the node 234.

At block 760, the calibration circuit may measure the compensated current, which results from the addition of the current from the IDAC to the baseline rectified current. In one embodiment, the calibration circuit receives a digital code representing the level of the compensated current. For example, the compensated current may be converted by current to code converter 117 to a digital code, which is transmitted to calibration circuit 700.

At decision block 762, the calibration circuit may determine if the compensated current is minimized using the currently selected IDAC value. In one embodiment, a calibration circuit, such as calibration circuit 700, compares a digitally coded value representing the compensated current with a threshold value to determine if the compensated current is sufficiently minimized. In one embodiment, the threshold value indicates a maximum acceptable current flow in either direction. If the compensated current flow is less than this threshold amount, the calibration circuit proceeds to block 764. Otherwise, the calibration circuit proceeds to block 768.

At block 768, the IDAC value may be adjusted. In one embodiment, this adjustment corresponds to a decrease in the current level that is output by the IDAC. Alternatively, the adjustment may cause an increase in the IDAC output current. Whether the IDAC current is increased or decreased at block 768 may depend on whether the current value to which the IDAC is set at block 756 or block 764 is higher or lower than the expected final compensation current. In one embodiment, a linear search algorithm is used, where the IDAC is set at a high initial value and the value is decreased incrementally to the target value. Alternatively, other search algorithms, such as successive approximation, may also be used. The IDAC value is set according to the search algorithm being used and the process continues at block 758 with the new IDAC setting.

Thus, blocks 768, 758, 760, and 762 may be repeated until the IDAC value sufficiently minimizes the compensated current. When the compensated current is sufficiently minimized by the IDAC value, the process continues at block 764, in accord with decision block 762.

At block 764, the IDAC value, which sufficiently minimizes the compensated current, may be stored in a memory of the calibration circuit. For example, the IDAC value may be stored as a digital value in memory 701 of calibration circuit 700.

At decision block 766, the calibration circuit may determine whether an IDAC value has been determined for all of the transmit and receive electrode pairs. If not all pairs have been processed, the process continues at block 770.

At block 770, the calibration circuit may connect the next pair of transmit and receive electrodes to the capacitive sensing circuit. The process then continues at block 756.

Thus, blocks 770, 756, 758, 760, 762, 768, 764, and 766 may be repeated until an IDAC value that sufficiently minimizes the compensated current has been determined for each transmit and receive electrode pair.

When an IDAC value has been determined for each transmit and receive electrode pair, the calibration process 750 continues to block 780 in accord with decision block 766. At block 780, the process 750 ends.

When the calibration process 750 is completed, a compensation current value has been determined for each transmit and receive electrode pair. In one embodiment, these compensation current values are stored in memory 701 of calibration circuit 700. During normal operation of the capacitance sensing circuit, when a particular transmit and receive electrode pair are selected, the associated compensation current value for that pair can be retrieved from memory 701 and used to set the output current of the compensation circuit. Thus, the calibration circuit and the compensation current level can compensate for differences in mutual and parasitic capacitances between different transmit and receive electrode pairs.

The embodiments described herein include a capacitance sensing circuit that senses a capacitance between a transmit and a receive electrode by applying a transmit signal to the transmit electrode to induce a current at the receive electrode. Embodiments of the capacitance sensing circuit also compensate for a baseline capacitance between the transmit and receive electrodes to optimize the dynamic range utilization of the capacitance sensing circuit.

The embodiments described herein may have the advantage of keeping all benefits of switching capacitor methods (especially in the high immunity for RF/EMI noise signals), and may be configured for easy implementation in existing devices from hardware and software perspectives, as well as in future devices.

Embodiments of the present invention, described herein, include various operations. These operations may be performed by hardware components, software, firmware, or a combination thereof. As used herein, the term "coupled to" may mean coupled directly or indirectly through one or more intervening components. Any of the signals provided over various buses described herein may be time multiplexed with other signals and provided over one or more common buses. Additionally, the interconnection between circuit components or blocks may be shown as buses or as single signal lines. Each of the buses may alternatively be one or more single signal lines and each of the single signal lines may alternatively be buses.

Certain embodiments may be implemented as a computer program product that may include instructions stored on a machine-readable medium. These instructions may be used to program a general-purpose or special-purpose processor to perform the described operations. A machine-readable medium includes any mechanism for storing or transmitting information in a form (e.g., software, processing application) readable by a machine (e.g., a computer). The machine-readable medium may include, but is not limited to, magnetic storage medium (e.g., floppy diskette); optical storage medium (e.g., CD-ROM); magneto-optical storage medium; read-only memory (ROM); random-access memory (RAM); erasable programmable memory (e.g., EPROM and EEPROM); flash memory; electrical, optical, acoustical, or other form of propagated signal (e.g., carrier waves, infrared signals, digital signals, etc.); or another type of medium suitable for storing electronic instructions.

Additionally, some embodiments may be practiced in distributed computing environments where the machine-readable medium is stored on and/or executed by more than one computer system. In addition, the information transferred between computer systems may either be pulled or pushed across the communication medium connecting the computer systems.

Although the operations of the method(s) herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative sense rather than a restrictive sense.

What is claimed is:

1. An apparatus, comprising:
   a capacitive sensor including a transmit electrode and a receive electrode, wherein the receive electrode is capacitively coupled with the transmit electrode;
   a signal generator coupled with the transmit electrode and configured to generate an induced current waveform at the receive electrode by applying a transmit signal to the transmit electrode;
   a demodulation circuit coupled with the receive electrode, wherein the demodulation circuit is configured to output a rectified current based on the induced current waveform; and
   a compensation circuit, coupled with the demodulation circuit, to add a compensation current to the rectified current to generate a compensated current waveform, wherein the compensation current is calibrated to cancel a portion of the rectified current attributable to a baseline capacitance of the transmit electrode and the receive electrode, the baseline capacitance comprising a capacitance of the transmit electrode and the received electrode when no input is present.

2. The apparatus of claim 1, wherein the compensation current is approximately equal to an amount of current attributable to the baseline capacitance of the transmit electrode and the receive electrode.

3. The apparatus of claim 1, wherein the compensation circuit comprises a programmable current digital to analog converter (IDAC).

4. The apparatus of claim 1, further comprising a calibration circuit configured to adjust the compensation current based on measured capacitance values.

5. The apparatus of claim 4, further comprising a memory configured to store a compensation current value, wherein the compensation current value is associated with a pair including the transmit electrode and the receive electrode.

6. The apparatus of claim 5, wherein the calibration circuit is configured to determine a compensation current value based on a measured capacitance between the paired transmit electrode and receive electrode.

7. The apparatus of claim 1, wherein the capacitive sensor further comprises a plurality of transmit electrodes and a plurality of receive electrodes.

8. The apparatus of claim 1, further comprising a transimpedance amplifier configured to generate an output voltage based on the compensated current waveform.

9. The apparatus of claim 1, further comprising a filter configured to reduce a ripple voltage of the compensated current waveform.

10. The apparatus of claim 1, wherein the demodulation circuit comprises:
    a first half wave rectifier coupled with the receive electrode and configured to output a positive rectified current based on a positive portion of the induced current waveform; and
    a second half wave rectifier coupled with the receive electrode and configured to output a negative rectified current based on a negative portion of the induced current waveform.

11. The apparatus of claim 10, wherein the compensation circuit comprises:
    a first current source configured to add the compensation current to the positive rectified current; and
    a second current source configured to add a second compensation current to the negative rectified current.

12. A method, comprising:
    applying a transmit signal to a transmit electrode capacitively coupled to a receive electrode to generate an induced current waveform at the receive electrode;
    rectifying the induced current waveform to generate a rectified current; and
    adding a compensation current to the rectified current to generate a compensated current waveform, wherein the compensation current is calibrated to cancel a portion of the rectified current attributable to a baseline capacitance of the transmit electrode and the receive electrode, the baseline capacitance comprising a capacitance of the transmit electrode and the received electrode when no input is present.

13. The method of claim 12, wherein the compensation current is approximately equal to an amount of current attributable to the baseline capacitance of the transmit electrode and the receive electrode.

14. The method of claim 12, further comprising adjusting the compensation current based on measured capacitance values.

15. The method of claim 14, further comprising storing a compensation current value, wherein the compensation current value is associated with a pair including the transmit electrode and the receive electrode.

16. The method of claim 15, further comprising determining a compensation current value based on a measured capacitance between the paired transmit electrode and receive electrode.

17. The method of claim 12, further comprising generating an output voltage based on the compensated current waveform.

18. The method of claim 12, further comprising reducing a ripple voltage of the compensated current waveform.

19. An apparatus, comprising:
means for generating an induced current waveform based on a capacitance value of a capacitive sensor;
means for generating a rectified current based on the induced current waveform; and
means for generating a compensated current waveform by adding a compensation current to the rectified current, wherein the compensation current is calibrated to cancel a portion of the rectified current attributable to a baseline capacitance of the capacitive sensor, the baseline capacitance comprising a capacitance of the transmit electrode and the received electrode when no input is present.

20. The apparatus of claim 19, wherein the compensation current is approximately equal to an amount of current that is attributable to the baseline capacitance of the capacitive sensor.

* * * * *